US00RE39967E

(19) United States
(12) Reissued Patent
Salafsky

(10) Patent Number: US RE39,967 E
(45) Date of Reissued Patent: Jan. 1, 2008

(54) SOLID-STATE PHOTOELECTRIC DEVICE

(75) Inventor: Joshua S. Salafsky, Burligame, CA (US)

(73) Assignee: The Trustees of Columbia University in the City of New York, New York, NY (US)

(21) Appl. No.: 10/449,163

(22) Filed: May 29, 2003

Related U.S. Patent Documents

Reissue of:
(64) Patent No.: 6,239,355
Issued: May 29, 2001
Appl. No.: 09/414,799
Filed: Oct. 8, 1999

U.S. Applications:
(60) Provisional application No. 60/103,758, filed on Oct. 9, 1998.

(51) Int. Cl.
*H01L 31/0352* (2006.01)
*H01L 31/04* (2006.01)

(52) U.S. Cl. ..... 136/250; 136/249; 136/252; 136/255; 136/256; 257/40; 257/43; 257/461; 257/464; 257/465; 438/63

(58) Field of Classification Search ..... 136/250, 136/249, 252, 255, 256; 257/40, 43, 461, 257/464, 465; 438/63
See application file for complete search history.

(56) References Cited

U.S. PATENT DOCUMENTS 3,038,952 A * 6/1962 Ralph ..... 438/63
3,186,873 A * 6/1965 Dunlap, Jr. ..... 136/249
3,522,339 A * 7/1970 Velde ..... 438/63
3,653,971 A * 4/1972 Lidorenko et al. ..... 136/244
3,690,953 A * 9/1972 Wise ..... 136/255
4,082,570 A * 4/1978 House et al. ..... 136/246
4,143,297 A * 3/1979 Fischer ..... 313/502
4,159,212 A * 6/1979 Yerkes ..... 136/247
4,175,981 A * 11/1979 Loutfy et al. ..... 136/255
4,270,263 A * 6/1981 Johnson et al. ..... 438/28
4,407,320 A * 10/1983 Levine ..... 136/250
4,902,567 A * 2/1990 Eilertsen et al. ..... 428/328

(Continued)

FOREIGN PATENT DOCUMENTS

JP 57-153478 A * 9/1982
JP 60-009179 A 1/1985
WO WO 97/15959 A1 * 5/1997
WO WO 99/39372 A1 * 8/1999

OTHER PUBLICATIONS

Salafsky et al, Chemical Physical Letters, 290, pp. 297–303, Jul. 1998.*
J.J.M. Halls et al., "Efficient Photodiodes from Interpenetrating Polymer Networks," Nature, vol. 376, pp. 498–500 (Aug. 1995).*
O'Reagan et al, "A Low–Cost, High–Efficiency Solar Cell Based on Dye–Sensitized Colloidal $TiO._2$ Films," Nature, vol. 353, pp. 737–740 (Oct. 1991).*

(Continued)

*Primary Examiner*—Nam Nguyen
*Assistant Examiner*—Jeffrey Barton
(74) *Attorney, Agent, or Firm*—Baker Botts L.L.P.

(57) ABSTRACT

A solid state photovoltaic device is formed on a substrate and includes a photoactive channel layer interposed between a pair of electrodes. The photoactive channel layer includes a first material which absorbs light and operates as a hole carrier. Within the first material are nanoparticles of a second material which operate as electron carriers. The nanoparticles are distributed within the photoactive channel layer such that, predominantly, the charge path between the two electrodes at any given location includes only a single nanocrystal. Because a majority of electrons are channeled to the electrodes via single nanocrystal conductive paths, the resulting architecture is referred to as a channel architecture.

26 Claims, 2 Drawing Sheets

U.S. PATENT DOCUMENTS

| | | | | | |
|---|---|---|---|---|---|
| 4,948,976 | A | * | 8/1990 | Baliga et al. | 250/370.06 |
| 5,279,679 | A | * | 1/1994 | Murakami et al. | 136/246 |
| 5,415,700 | A | * | 5/1995 | Arthur et al. | 136/250 |
| 5,571,612 | A | * | 11/1996 | Motohiro et al. | 428/323 |
| 5,674,325 | A | * | 10/1997 | Albright et al. | 136/250 |
| 5,714,391 | A | * | 2/1998 | Omura et al. | 438/99 |
| 5,720,827 | A | * | 2/1998 | Simmons | 136/250 |
| 5,868,869 | A | * | 2/1999 | Albright et al. | 136/250 |
| 6,281,430 | B1 | * | 8/2001 | Lupo et al. | 136/263 |
| 6,512,172 | B1 | * | 1/2003 | Salafsky et al. | 136/256 |
| 6,613,598 | B1 | * | 9/2003 | Middelman et al. | 438/30 |
| 6,649,824 | B1 | * | 11/2003 | Den et al. | 136/252 |
| 6,812,636 | B2 | * | 11/2004 | Porter et al. | 313/496 |
| 2002/0192441 | A1 | * | 12/2002 | Kalkan et al. | 428/209 |
| 2003/0170959 | A1 | * | 9/2003 | Salafsky | 438/305 |
| 2004/0003838 | A1 | * | 1/2004 | Curtin | 136/250 |
| 2004/0118448 | A1 | * | 6/2004 | Scher et al. | 136/252 |
| 2005/0196596 | A1 | * | 9/2005 | Salafsky | 428/209 |

OTHER PUBLICATIONS

G. Yu et al., "Polymer Photovoltaic Cells: Enhanced Efficiencies Via a Network of Internal Donor–Acceptor Heterojunctions," Science, vol. 270, pp. 1789–1791 (Dec. 1995).*

XP–002130865 "Solid State Polymer–Semiconductor Nanocrystal Photovoltaic Devices," J.S. Salafsky, R.E.I. Schropp, Debye Institute, University of Ultrecht, The Netherlands, 2nd World Conference and Exhibition on Photovoltaic Solar Energy Conversion, Jul. 6–10, 1998, pp. 272–275.*

XP–002060964 "Charge Separation and Transport in Conjugated–Polymer/Semiconductor–nanocrystal Composites Studied by Photoluminescence Quenching and Photoconductivity," N.C. Greenham, Xiaogang Peng and A.P. Alivsatos, Department of Chemistry, University of California, and Molecular Design Institute, Berkeley, CA 94720, Physics Review B, vol. 54, No. 24, Dec. 15, 1996, pp. 17628–17637.*

XP–002060965 "Charge Separation and Transport in Conjugated Polymer/Cadmium Selenide Nanocrystal Composites Studies by Photoluminescence Quenching and Photoconductivity," N.C. Greenham, Xiaogang Peng and A.P. Alivsatos, Department of Chemistry, University of California, and Molecular Design Institute, Berkeley, CA 94720, 1997, pp. 545–546, Synthetic Materials, vol. 84.*

XP–000720223 "Enhanced Luminance in Polymer Composite Light Emitting Devices," S.A. Carter, Department of Physics, University of California, Santa Cruz, CA 95064; J.C. Scott and Brock; IBM Almaden Research Division, San Jose, CA 95120, pp. 1145–1147, Appl. Phys. Lett., vol. 71, No. 9, Sep. 1, 1997.*

XP–002130866 "Exciton Dissociation, Charge Transport, and Recombination in Ultrathin, Conjugated Polymer–TiO2 Nanocrystal Intermixed Composites," J.S. Salafsky, Debye Institute, University of Ultrecht, The Netherlands, pp. 10885–10894, Apr. 15, 1999, Physics Review B, vol. 59, No. 16.*

Patent Abstracts of Japan, Publication No. 57/084185, titled "Photoelectric Converter," by Kagawa Toshiaki, May 1982.*

Patent Abstracts of Japan, Publication No. 59/229863, titled "Manufacture of Color Sensor," by Nishioka Yoichi, Dec. 1984.*

XP–002060965 "Charge Separation and Transport in Conjugated Polymer/Cadmium Selenide Nanocrystal Composites Studied by Photoluminescence Quenching and Photoconductivity" N.C. Greenham, X. Peng and A.P. Alivisatos, Dept. of Chem., Univ. of California, and Molecular Design Institute, Berkeley, CA 94720, 1997, pp. 545–546, Synthetic Metals, vol. 84.*

European Patent Office Communication Pursuant to Article 96(2) EPC for Application No. 99 956 523.7, dated Jan. 27, 2006.

* cited by examiner

SOLID-STATE PHOTOELECTRIC DEVICE

Matter enclosed in heavy brackets [ ] appears in the original patent but forms no part of this reissue specification; matter printed in italics indicates the additions made by reissue.

SPECIFICATION

The present application claims priority to U.S. Provisional Application, Ser. No. 60/103,758, entitled Solid-State Photodevice Using a Channel Architecture, which was filed on Oct. 9, 1998.

FIELD OF THE INVENTION

The present invention relates generally to photoelectric devices and more particularly relates to solid state photoelectric devices which employ a channel architecture.

BACKGROUND OF THE INVENTION

Photovoltaic cells were first developed in the 1950's as p-n junctions of inorganic materials. A wide variety of cells since then have been fabricated using homojunction, heterojunction and tandem architectures with inorganic materials, most commonly silicon. As solar cells, the devices convert solar radiation (sunlight) directly into direct-current electrical power. However, widespread terrestrial use of the cells has been impeded by the high peak-watt energy cost compared with that derived from oil, natural gas, and coal.

Amorphous silicon has been contemplated as a highly promising alternative to the more expensive crystalline silicon and efforts have been undertaken at constructing cells from this material. However, at present the best silicon photovoltaic cells are about seven times more expensive than conventional energy sources.

An alternative to silicon-based cells was introduced by Graetzel et al. of EPFL-Lausanne, Switzerland. The cell developed by Graetzel et al. is about as efficient as the best amorphous silicon devices; however, these cells employ a liquid electrolyte which requires that the cells be hermetically sealed. In practice, such sealing can be difficult to achieve. If the cells are not properly sealed, the electrolyte can evaporate with a concomitant decrease in efficiency.

The cell introduced by Graetzel et al. is an example of a relatively efficient photovoltaic device which is fairly simple to fabricate using low-cost materials. The operating principle is based on the dye-sensitization of a wide-band gap metal oxide, nanoporous semiconductor layer. In particular, the layer is formed with an interconnected network of nanocrystals of titanium dioxide coated with a single molecular layer of a light absorbing ruthenium-based dye. When the dye layer absorbs light, electrons are transferred to the nanocrystal conduction band. The charge is transported through a number of nanocrystals in the nanocrystal layer (on the order of microns thick) to a transparent, conducting oxide electrode. The circuit is completed with an electrolyte with a rodox couple and a counter electrode impregnated with a platinum catalyst.

Conjugated polymers have been developed which are promising for a variety of electronic device applications, such as FETs, photovoltaic cells, LEDs and lasers. Photovoltaic devices using conjugated polymers blended with $C_{60}$ have been formed in both a p-type junction architecture, as well as in an interpenetrating network architecture of semiconductor nanocrystals. However, the efficiencies of these devices tend to be much lower than those of the Graetzel device or silicon devices. Because of such inefficiencies, such devices are not currently viable candidates for widespread commercialization.

The photovoltaic devices in the prior art can be grouped into two basic architectures. The conventional photovoltaic devices (inorganic materials such as silicon) and several of the conjugated polymer devices are planar junction devices. In these devices, the free charge carriers, or excitons, created by light absorption diffuse to the junction interface where they are spatially separated, leading to the photovoltaic effect.

The other group embodies an interpenetrating network architecture and includes the Graetzel cell and the conjugated polymer devices blended with $C_{60}$ and semiconductor nanocrystals. In this type of architecture, elements of one type of material, for example semiconductor nanocrystals or $C_{60}$ molecules, interpenetrate another material where they are physically and electrically coupled to form a charge-transporting network. The network is necessary in the case of the dye-sensitized nanocrystal device to produce sufficient surface area, and thus dye area, to effect adequate light absorption. In devices formed from conjugated polymers blended with other polymers, nanocrystals or $C_{60}$ molecules, the structure and operation of the devices is based on an interpenetrating network wherein elements of the latter materials are electrically interconnected and embedded within the polymer material.

Despite the extensive work previously conducted in the field of photovoltaics, there remains a need for a device which exhibits high efficiency, low cost and ease of fabrication which is formed in a fully solid-state embodiment.

SUMMARY OF THE INVENTION

An object of the present invention is to provide a solid-state photovoltaic or photoelectric device constructed from relatively low-cost materials which is inexpensive, simple to fabricate and exhibits a high efficiency for converting incident radiation to electric power.

In accordance with a first embodiment, a photoelectric device includes a substrate, a first electrode formed on the substrate, a photoactive channel layer and a second electrode. The photoactive channel layer is interposed between the first and second electrodes. A photoactive channel layer is defined as a layer formed with a first material and a second material wherein an average distribution of the first material within the second material is such that, predominantly, only a single particle of the first material is interposed between the first electrode and the second electrode along any imaginary normal axis extending between the two electrodes.

The photoactive channel layer can include a conjugated polymer material and a semiconductor particulate material. The semiconductor particulate material can take the form of nanoparticles having an average diameter and wherein the conjugated polymer material has a thickness in the range of one to two times the average diameter of the nanoparticles. The nanoparticles can be semiconductor crystals, such as titanium dioxide.

In an alternate embodiment, multiple photoelectric devices can be formed in a stacked configuration on a common substrate. In this case, the devices can be formed such that they are responsive to light in more than one spectral band. In either the single or stacked configuration, the device can be formed such that it is mechanically flexible.

BRIEF DESCRIPTION OF THE DRAWING

Further objects, features and advantages of the invention will become apparent from the following detailed description taken in conjunction with the accompanying figures showing illustrative embodiments of the invention, in which.

Figure 1:
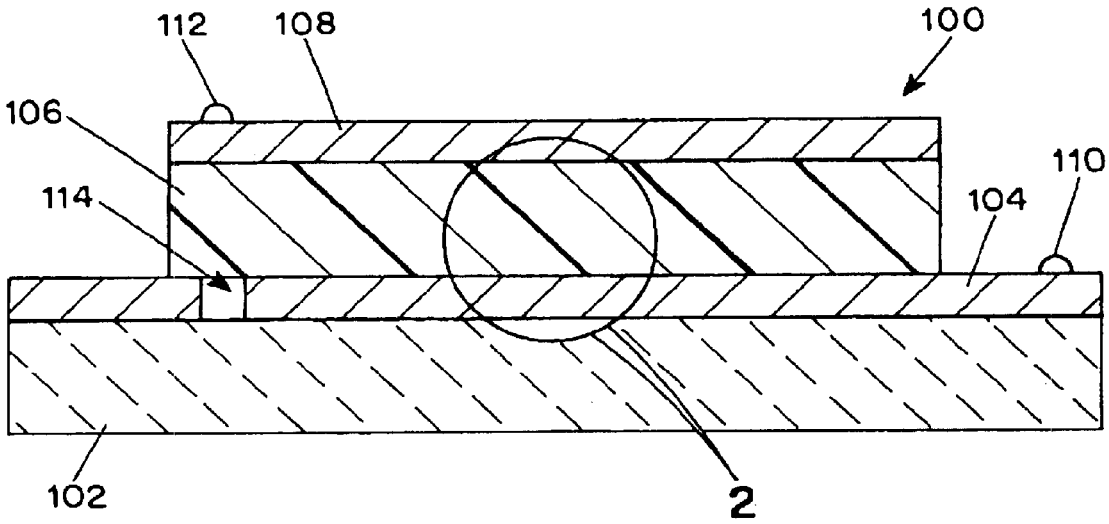
FIG. 1 is a schematic diagram of a photoelectric device in accordance with the present invention, illustrating the channel architecture having a photoactive channel layer separating a pair of electrodes.

Throughout the figures, the same reference numerals and characters, unless otherwise stated, are used to denote like features, elements, components or portions of the illustrated embodiments. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

FIG. 1 is a schematic diagram of a photoelectric device formed in accordance with the present invention which is based on a novel channel architecture. As used herein, the term photoelectric device includes devices which produce electrical energy when exposed to light (e.g., photovoltaic) as well as devices which generate light in the presence of applied electrical energy (e.g., photoemissive). The photoelectric device 100 is formed on a substrate 102, such as glass. A transparent conducting oxide (TCO) layer 104 is formed on the substrate 102 and operates as a first electrode for the device 100. A portion of the TCO layer 104 is covered with a photoactive layer 106. A second electrode 108 is formed over at least a portion of the photoactive layer 106. A first electrical contact 110 is formed on the TCO layer 104 and a second electrical contact 112 is formed on the second electrode 108 to facilitate connection of the photoelectric device 100 to external circuitry.

In the exemplary configuration of FIG. 1, at least a portion of light which is incident on the surface of the substrate 102 passes through the substrate 102 and TCO layer 104 where photons are absorbed by the photoactive channel layer 106. If the second electrode 108 does not permit non-absorbed light to pass therethrough, such non-absorbed light is reflected back into the photoactive layer 106 where the photons can be absorbed. Alternatively, the second electrode 108 can be formed from a TCO and light which is incident upon the surface of the second electrode 108 can be transmitted to the photoactive layer 106 for absorption. In this case, the substrate 102 and layer 104 may be, but do not need to be, transparent, translucent or opaque.

Figure 2:
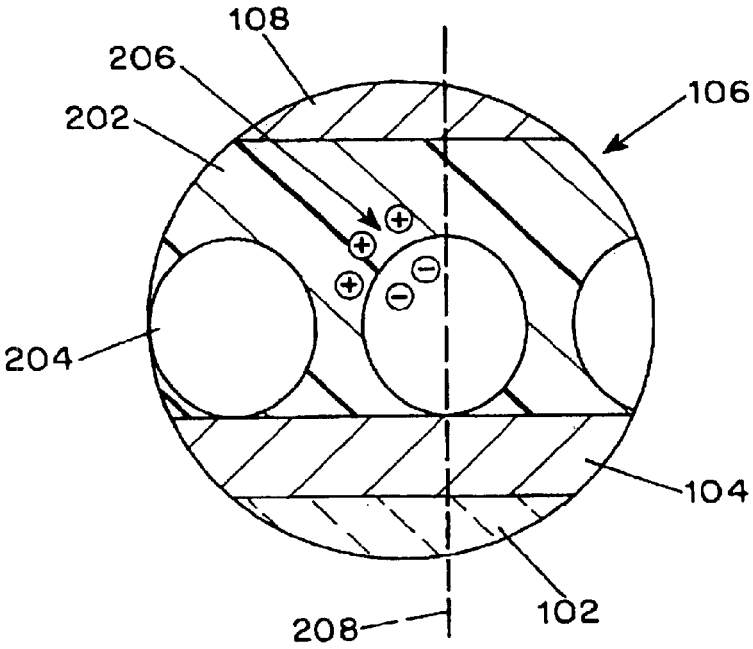
FIG. 2 is a schematic diagram showing an enlarged portion of the device illustrated in FIG. 1 and further illustrating the photoactive channel layer.

FIG. 2 is a schematic diagram further illustrating the channel architecture of the photoactive layer 106. The photoactive layer 106 is generally formed with a first material (component A), which absorbs light and operates as a hole carrier. The first material can take the form of a conjugated polymer layer 202, such as poly(p-phenylene vinylene) (PPV). Particles of a second material (component B), such as nanoparticles 204, reside within the first material. The to term nanoparticles, as used herein, refers to particles, generally of crystalline structure, on the order of one to hundreds of nanometers in diameter. As used herein, the term channel architecture refers to a photoelectric device having a photoactive layer 106 wherein the average distribution of the first material (e.g., nanoparticles 204) within the second material (e.g., polymer layer 202) is such that, predominantly, only a single particle of the first material (e.g., nanocrystal 204) is interposed between the first electrode 104 and the second electrode 108 along any imaginary normal axis 208 extending between the two electrodes. When this condition is satisfied, the photoactive layer 106 is a photoactive channel layer.

The device illustrated in FIGS. 1 and 2 operates in the following manner. Light incident on the device passes through the transparent or semi-transparent substrate 102 and TCO layer 104 to the photoactive layer 106. Light in the visible and near-UV region of the spectrum can be absorbed by polymer layer 202 and converted to singlet excitons which diffuse to a nanocrystal interface 206. At the interface 206, the excitons become dissociated; i.e., electrons are transferred to the nanoparticles 204 leaving holes behind in the polymer film 202. Radiation with photon energies above the bandgap of the nanoparticles can be absorbed by the nanoparticles 204 to give free charge carriers followed by a hole transfer process to the polymer. Because the photoactive layer 106 is formed such that on average, the predominant charge path is defined by only a single nanocrystal 204 interposed between the first electrode 104 and the second electrode 108 at any given location, a majority of electrons are channeled by a single nanocrystal directly to the second electrode 108 (i.e., without requiring a passage to other nanoparticles as in a network architecture). In a similar fashion, holes are transported through the polymer 202 to the first electrode 104. This results in an electrical current in an external circuit connected across contacts 110, 112.

Figure 3:
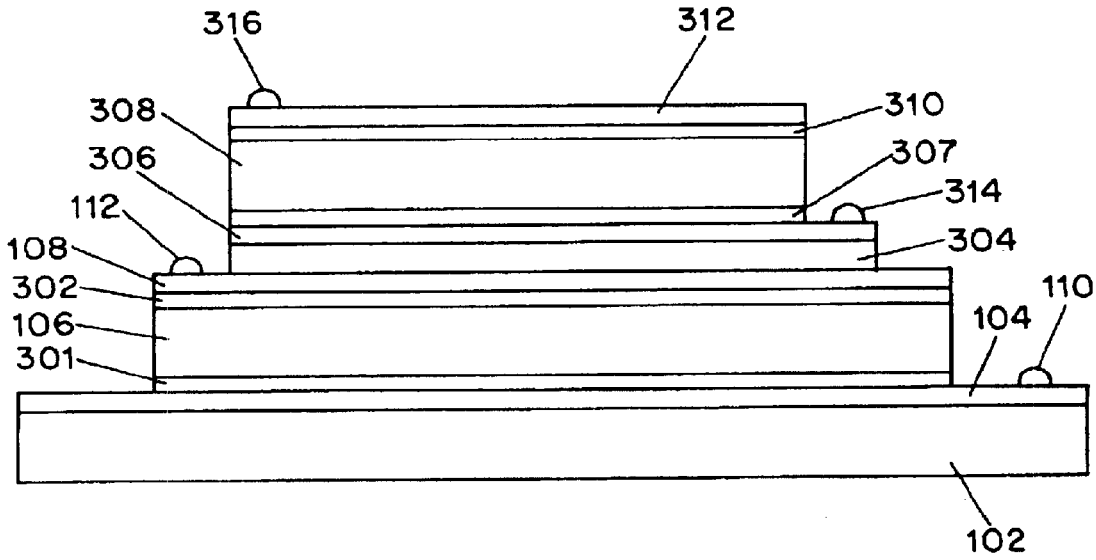
FIG. 3 is a schematic diagram of an alternate embodiment of a photoelectric device in a stacked configuration, in accordance with the present invention.

The nanoparticles 204 generally take the form of semiconductor crystals, such as titanium dioxide ($TiO_2$) and have a diameter in a range between 30 and 80 nanometers. The thickness of the polymer layer 202 is preferably on the order of between 1 and 1.5 times the average diameter of the nanoparticles 204. However, the layer 202 can be formed with sufficient thickness such that a region of the polymer material exists between the edge of the nanoparticles 204 and the second electrode 108. This polymer region acts as a blocking layer which inhibits bidirectional charge carrier flow, thereby reducing electron-hole recombination at the second electrode 108. Alternatively, the thickness of the polymer can be reduced and an additional blocking layer 302 can be formed between the polymer layer 202 and the second electrode 108, as illustrated in FIG. 3. The use of a separate blocking layer, in combination with a thinner polymer layer, may improve device efficiency as more excitons which form within the polymer layer 202 will be within one diffusion length of a nanocrystal interface 206. However, the addition of a separate blocking layer adds an additional processing step, which will generally increase the device cost.

The individual chains of the polymer forming polymer layer 202 can have a variety of size distributions. The nanoparticles 204 should be somewhat monodisperse, of roughly spherical morphology and exhibit an average diameter from on the order of a few nanometers to hundreds of nanometers. When distributed in the polymer layer 202, the spacing between nanoparticles 204 is preferably on the order of the diffusion length of an exciton in the particular polymer. This is generally in the range of about 10–30 nm, but can vary outside of this range.

The nanoparticles 204 can be prepared as a dispersion in methanol or water. The crystal structure of the nanoparticles 204 may be either anatase, rutile, brookite, some other form known in the field, or some mixture thereof. The soluble precursor form of the PPV, in a roughly 1 weight % preparation in 95:5 methanol:water (by volume) solvent, can be mixed with the nanocrystal sample to yield a mixture with about 65% by weight nanoparticles. The nanocrystal-polymer mixture may require some solvent evaporation to allow for a suitable viscosity for spin-coating. A portion 114 of the TCO layer 104 located in a region under contact 112 can be removed, such as by chemical etching (using HCl and Zn as a catalyst). This can reduce the likelihood of a short circuit between the first electrode 104 and second electrode 108 which can result from pressure exerted by contact 112 through the mechanically soft polymer-nanocrystal photoactive layer 106 when making contact to the device.

The polymer-nanocrystal mixture can be spin-coated on the TCO layer 104 at a suitable speed and duration to establish a desired thickness of the polymer layer 202 and distribution of the nanoparticles 204. For the above-described solution, spin coating at 1000 RPM for about 2 minutes provides suitable results. The polymer-nanocrystal solution should be allowed to dry for several minutes. The precursor-PPV in the film can be converted to the final form, PPV, by thermal heating at 150° C. in a nitrogen environment. The second electrode 108 can be formed over the photoactive layer 106 by vapor deposition of aluminum, or other suitable conductive material.

FIG. 3 illustrates an alternate embodiment of the present invention wherein two photoelectric devices, substantially as described in connection with FIGS. 1 and 2, are cooperatively formed on a common substrate 102 in a stacked configuration. Such an embodiment is particularly useful in detecting multiple wavelengths of incident light. As with the embodiment of FIG. 1, the device of FIG. 3 includes a substrate 102, a first electrode 104, a first photoactive channel layer 106, a second electrode 108 and contacts 110, 112. In addition, the device 300 includes a blocking layer 302 interposed between the photoactive layer 106 and the second electrode 108. The device 300 also includes an electrical isolating layer 304. A second photoelectric device is formed over the isolating layer 304 which includes a third electrode 306, a second photoactive channel layer 308, a second blocking layer 310, a fourth electrode 312 and contacts 314, 316.

As illustrated in FIG. 3, one or more blocking layers 301, 302, 307, 310 can be interposed between the electrodes and the photoactive layer. The blocking layers are selected to allow only one charge carrier type to pass to the underlying contact and thereby reduces charge recombination at the electrode-photoactive layer interface. For example, with metal oxide semiconductor nanoparticles and a conjugated polymer layer, a thin layer of metal oxide can be applied to the electrodes to operate as a blocking layer. This can be accomplished by a number of known techniques, such as spin-coating followed by thermal firing, chemical vapor deposition, physical vapor deposition, etc. Blocking layers may also be composed of polymer materials which pass one charge carrier type while blocking the other.

In this embodiment, the blocking layer 302, second electrode 108, isolating layer 304 and third electrode layer 306 should be substantially transparent to allow transmission of incident light to the second photoactive layer 308. Preferably, the first photoactive layer 106 is selected to be responsive to a first wavelength of incident light whereas the second photoactive layer 308 is selected to be responsive to a second wavelength of incident light. For example, a PPV-$TiO_2$ combination, which is responsive to light of about 350–500 nm, can be used for the first photoactive channel layer 106 and a MEH-PPV-$TiO_2$ combination, which is responsive to light in the region of about 500–600 nm, can be used to form the second photoactive channel layer 308, where MEH-PPV is poly(2-methoxy-5-(2'-ethyl-hexyloxy)-1,4-phenylene vinylene).

The device materials and preparation conditions described herein may be widely varied while still achieving a photoelectric device with the desired channel architecture. The material composition, size and shape of the nanoparticles, as well as the type of polymer or the size distribution of the polymers can also be varied. For example, MEH-PPV, MEH-CN-PPV, POPT-poly(octylthiophene) or other such conjugated polymers may be used. Both the polymer and the nanocrystal materials can be doped to improve the charge transport properties. Materials other than conjugated polymers or nanoparticles may be used. For instance, particles of amorphous metal oxides may replace the nanoparticles, a dyestuff may replace the conjugated polymer, or a combination of dyestuffs and polymers can be used with nanoparticles of other suitable particles. In general, many combinations of material components can be used as long as at least two of the components exhibit a mutual, photoinduced charge transfer process and the materials are arranged in the channel architecture, i.e., a predominance of single nanocrystal charge paths between a first and second electrode at any given point.

The size, shape and composition of electrodes 104, 108 can be varied. For example, a wide range of metals including Cu, Al, Ag, Au and others may be used in addition to various TCOs. The electrodes can also be composed of polymeric electrodes such as PEDOT (a highly conductive p-doped polythiophene polymer). Furthermore, the composition of the supporting substrate 102 may be varied. For instance, the substrate layer 102 may be a polymer or polymer foil, such as polyethylene terephthalate, polyvinyl chloride, aramid or polyamide, and also metal foils provided with an insulating top layer, glass or other layer. The substrate 102 is generally transparent or translucent, however, the substrate can be formed from an opaque material if the materials on the opposing side of the photoactive channel layer(s) are formed from a transparent or translucent material.

The electrodes and substrates of the device can be curvilinear or mechanically flexible resulting in a light-weight device suitable for building applications among others. The device can be made integrally or separately (modular or in sections) according to the advantages of each mode of fabrication. The electrode etching can be done in a variety of methods available to a person skilled in the art. The photoactive channel layer 106 can be applied via means other than spin-coating, such as by spin-casting, spraying, chemical vapor deposition, physical vapor deposition, dip-coating, printing, painting, etc. The TCO layer 104 can be formed in a known manner, such as by Metal Organic Chemical Vapor Deposition (MOCVD), sputtering, Atmospheric Pressure Chemical Vapor Deposition (APCVD), PECVD, evaporation, screen printing, sol-gel processing, etc. Examples of materials suitable for use as the TCO layer 104 are indium tin oxide, tin oxide, $SnO_2$:F, etc. For each of the processing steps described herein, a range of processing temperatures pressures, and other process parameters can be used to achieve the desired channel architecture.

The present invention employs a novel channel architecture to achieve a highly efficient, solid state photoelectric device. The channel architecture lends itself to the use of low cost materials and low cost manufacturing steps, which result in a cost-effective end product.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A photoelectric device, comprising:

a substrate:

a first electrode formed on said substrate;

*a second electrode spaced apart from and being in opposing relationship to the first electrode; and* a photoactive channel layer *interposed between the first electrode and the second electrode*, [said] *the* photoactive channel layer including a hole carrying material [with] *and* semiconductor [particulate material including] nanoparticles [having an average diameter therein, said hole carrying material having a thickness in the range of one to two times the average diameter of the nanoparticles; and], *wherein an average distribution of the semiconductor nanoparticles within the photoactive channel layer is such that predominantly, only a single nanoparticle is interposed between the first electrode and the second electrode along any straight-line path extending between oppositely-situated locations of the first and second electrodes*

[a second electrode; said photoactive channel layer being interposed between said first and second electrodes].

2. The photoelectric device according to claim 1 wherein said hole carrying material is a conjugated polymer material.

3. The photoelectric device according to claim 2 wherein said polymer is poly(p-phenylene vinylene).

4. The photoelectric device according to claim 3 wherein the nanoparticles are titanium dioxide.

5. The photoelectric device according to claim 1 wherein the photoactive layer includes a dyestuff material.

6. The photoelectric device according to claim 1 wherein said substrate and said first electrode are formed from a material which transmits at least a portion of incident light to said photoactive channel layer.

7. The photoelectric device according to claim 6 wherein the substrate material is glass.

8. The photoelectric device according to claim 6 wherein the first electrode material is a transparent conducting oxide.

9. The photoelectric device according to claim 1 wherein the second electrode is formed from a material which transmits at least a portion of incident light to said photoactive channel layer.

10. The photoelectric device according to claim 9 wherein the second electrode material is a transparent conducting oxide.

11. The photoelectric device according to claim 1 wherein the substrate, first electrode, second electrode and photoactive channel layer are formed from mechanically flexible materials.

12. A photoelectric device comprising a substrate;

a first electrode formed on said substrate;

*a second electrode spaced apart from and being in opposing relationship to the first electrode;* a first photoactive channel layer *interposed between the first electrode and the second electrode, the photoactive channel layer including a hole carrying material and semiconductor nanoparticles, wherein an average distribution of the semiconductor nanoparticles within the first photoactive channel layer is such that predominantly, only a single nanoparticle is interposed between the first electrode and the second electrode along any straight-line path extending between oppositely-situated locations of the first and second electrodes*;

[a second electrode, said first photoactive channel layer being interposed between said first and second electrodes;]

an electrical insulating layer, said insulating layer being formed on said second electrode;

a third electrode disposed over said insulating layer;

a second photoactive channel layer; and a fourth electrode, said second photoactive channel layer being interposed between said third and fourth electrodes.

13. The photoelectric device according to claim 12 wherein at least one of said first and second photoactive channel layers includes a conjugated polymer material and a semiconductor particulate material.

14. The photoelectric device according to claim 13 wherein the semiconductor particulate material includes nanoparticles having an average diameter and wherein the conjugated polymer material has a thickness in the range of one to two times the average diameter of the nanoparticles.

15. The photoelectric device according to claim 14 wherein said first photoactive channel layer is responsive to incident light in a first spectral range and said second photoactive channel layer is responsive to incident light in a second spectral range.

16. The photoelectric device according to claim 15 wherein the nanoparticles in at least one of said first and second channel layers are titanium dioxide.

17. The photoelectric device according to claim 16 wherein the polymer material of one of said first and second photoactive channel layers is PPV and the other of said first and second photoactive channel layers is MEH-PPV.

18. The photoelectric device according to claim 12 wherein at least one of the photoactive layers includes a dyestuff material.

19. The photoelectric device according to claim 12 wherein said substrate, said first electrode, said first photoactive channel layer, said second electrode and said insulating layer are formed from materials which transmit at least a portion of incident light to said second photoactive channel layer.

20. The photoelectric device according to claim 19 wherein the substrate material is glass.

21. The photoelectric device according to claim 19 wherein the electrode materials are transparent conducting oxide.

22. The photoelectric device according to claim 12 wherein the fourth electrode is formed from a material which transmits at least a portion of incident light to said second photoactive channel layer.

23. The photoelectric device according to claim 22 wherein the fourth electrode material is a transparent conducting oxide.

24. The photoelectric device according to claim 12 wherein the device is mechanically flexible.

*25. The photoelectric device of claim 1, wherein the nanoparticles have an average dimension along a direction extending between the first and the second electrodes, and wherein the photoactive channel layer has a thickness in the range of one to two times the average dimension of the nanoparticles.*

*26. The photoelectric device of claim 1, wherein the nanoparticles have a spheroidal morphology having an average diameter.*

* * * * *